United States Patent [19]

Jones et al.

[11] 4,291,068

[45] Sep. 22, 1981

[54] METHOD OF MAKING SEMICONDUCTOR PHOTODETECTOR WITH REDUCED TIME-CONSTANT

[75] Inventors: Terry L. Jones, Springfield; Brian S. Miller, Alexandria, both of Va.

[73] Assignee: The United States of America as represented by the Secretary of the Army, Washington, D.C.

[21] Appl. No.: 956,315

[22] Filed: Oct. 31, 1978

[51] Int. Cl.³ .................. B05D 5/12; H01L 27/14; H01L 31/00
[52] U.S. Cl. .................................. 427/88; 29/572; 156/655; 156/659.1; 156/662; 156/667; 357/30; 357/55; 430/313; 430/317; 427/43.1; 427/77
[58] Field of Search ...................... 357/17–19, 357/28, 55, 29–32, 56, 65, 68; 29/572; 427/39, 43, 36, 74, 75, 77, 78, 88, 89, 90; 313/309, 336; 315/10; 156/653, 655, 657, 659, 662, 667, 648, 649; 250/492; 430/296, 313, 317, 329

[56] References Cited

U.S. PATENT DOCUMENTS

| | | | |
|---|---|---|---|
| 3,419,746 | 12/1968 | Crowell et al. | 357/31 X |
| 3,523,208 | 8/1970 | Bodmer et al. | 357/31 X |
| 3,605,037 | 9/1971 | D'Asaro | 357/18 X |
| 3,725,743 | 4/1973 | Murayama | 29/589 X |
| 3,864,720 | 2/1975 | Merrin | 357/17 |
| 3,998,678 | 12/1976 | Fukase et al. | 427/77 X |
| 4,131,488 | 12/1979 | Lesk et al. | 357/30 X |
| 4,135,290 | 1/1979 | Evans | 29/572 |

Primary Examiner—William A. Powell
Attorney, Agent, or Firm—Nathan Edelberg; Milton W. Lee; Aubrey J. Dunn

[57] ABSTRACT

An insulating layer on the surface of a slab of photo-responsive semiconductor material is treated to produce a pattern of projections or mesas. The treatment includes the steps of producing a mask on the insulating layer using electron-beam lithography, etching holes in the layer through the mask, stripping the mask, and finishing with the usual electrical conductors on the insulating layer. An alternate embodiment etches the surface of the slab to produce a scrabrous surface, then coats with aluminum oxide and electrical conductors.

1 Claim, 2 Drawing Figures

4,291,068

METHOD OF MAKING SEMICONDUCTOR PHOTODETECTOR WITH REDUCED TIME-CONSTANT

The invention described herein may be manufactured, used and licensed by the U.S. Government for governmental purposes without the payment of any royalties thereon.

BACKGROUND OF THE INVENTION

This invention is in the field of semiconductor photovoltaic detectors. Such detectors include those having a semiconductive chip or slab, one side of which is exposed to radiation to be detected. The other side may be covered with an insulating layer, and with a conductive layer atop the insulating layer. A voltage source connected between the chip and the conductive layer biases the chips for electron emission. Such detectors are known in the art as photocathodes. The insulating layer is usually relatively thick, because thin insulating layers are prone to having pinholes. Such pinholes allow the conductive coating (when applied) to contact the chips, and such contact will degrade the electron image on the chips. A thick insulating layer, however, limits the frequency response or recovery time of the detector. Our invention is able to resolve the mutually contradictory requirements for the insulating layer.

SUMMARY OF THE INVENTION

The invention is a method of making photocathode having either a scabrous semiconductor surface beneath an insulating layer, or having a smooth semiconductor surface beneath a patterned insulator layer. In either case, the insulator is covered with an electrical conductor or conductors. The scabrous surface may be produced by ion bombardment or by etching; the patterned insulator may be produced by electron-beam lithography.

DETAILED DESCRIPTION OF THE INVENTION

Figure 1:
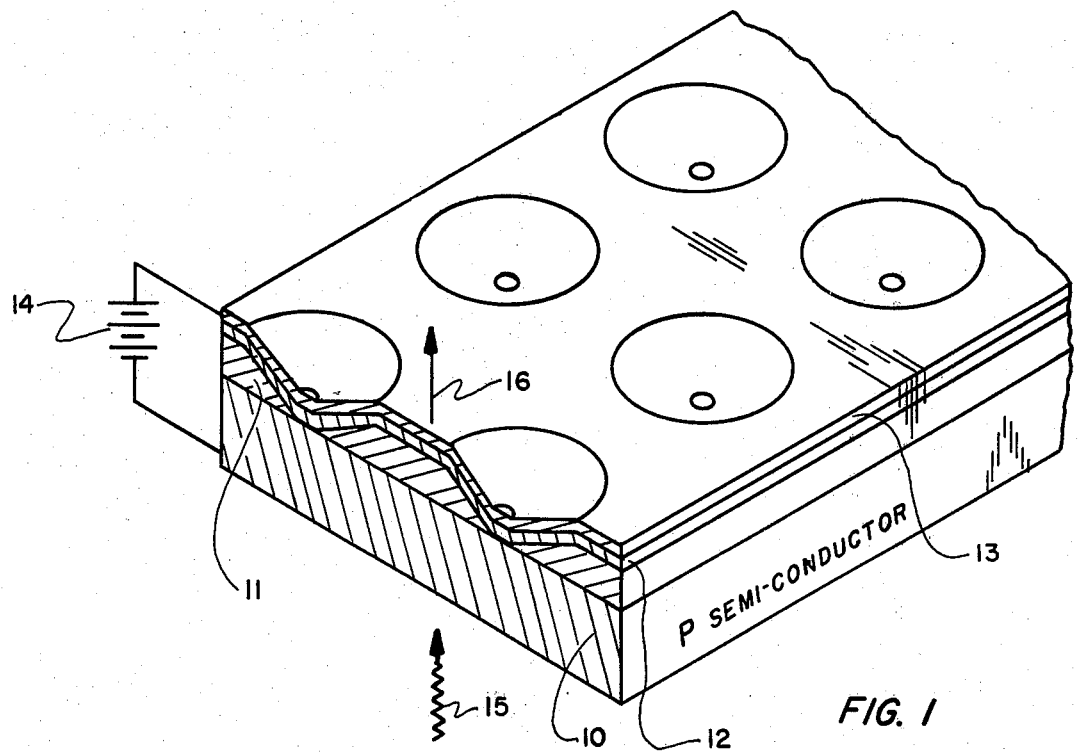
FIG. 1 schematically shows one embodiment of the invention.

The invention may perhaps be best understood by referring to the drawings, in which FIG. 1 shows an embodiment of detector including silicon semiconductor layer or chip 10 with patterned insulator layer 11 atop 10, insulator layer 12 atop 11, and conductive layer 13 atop 12. As can be seen on the drawings, layer 11 has a pebbled or dimpled surface. For a p-type semiconductor, battery 14 will be connected as show, radiation will fall on the chip in the direction as indicated by arrow 15, and electrons will be emitted in the direction of arrow 16. This detector may be produced by the following process:

coat chip 10 with a layer of aluminum oxide 0.2 to 1.0 μm thick;

coat the aluminum oxide layer with an electron-sensitive layer;

scan the electron-sensitive layer with an electron beam in a predetermined pattern;

develop the electron-sensitive layer to produce a patterned (perforated) mask;

etch the aluminum oxide through the mask;

remove the electron-sensitive layer mask;

coat the aluminum oxide layer with another layer of aluminum oxide (about 500 Å thick);

mask the 500 Å layer of aluminum oxide for a desired conductor pattern;

deposit a conductive material through the mask onto the aluminum oxide; and remove the mask.

Although other insulating layers may be used, we have specified aluminum oxide, since it is the usual insulator used for the inventive type of detector. The mask pattern derived from the electron-sensitive layer is such that layer 11 has a pebbled or dimpled surface, as previously mentioned. A typical dimple diameter is 300 Å, with a 25 μm center-to-center spaceing. For very low light levels, the ratio of dimple diameter to spacing must be very small. If desired, layer 13, (and/or 12 if 13 is not continuous) may be coated with a photoemitter layer. The thin regions of 11 will have higher electrical field intensities than the thicker regions and will thus cause crowding of minority carriers beneath the thin regions. This crowding will effectively reduce the detector time-constant.

Figure 2:
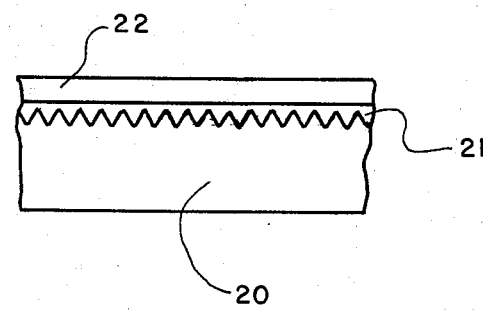
FIG. 2 schematically shows another embodiment of the invention.

An alternate embodiment of the invention to produce a structure, as shown in FIG. 2 is the following process:

on semiconductor chip 20 deposit an electron-sensitive layer;

scan the layer in a predetermined pattern with an electron beam;

develop the layer to yield a perforated mask;

etch the semiconductor through the mask; and remove the mask.

These steps will produce a patterned surface on the chip. The detector may be completed as follows:

coat the semiconductor with insulating layer 12;

back etch layer 12 to produce a relatively smooth surface; and deposit desired conductor(s) 22 on the insulating layer. The patterned surface on the chip may be produced by other methods, such as orientational etching, or by the method taught in copending and coassigned application Ser. No. 928,033 filed July 25, 1978, issued July 3, 1979 as U.S. Pat. No. 4,160,045. This application teaches a method for producing a scabrous surface on a semiconductor chip by coating the chip with small islands of a high-energy-ion-resistant material, then bombarding the chip and material with ions to produce sputtering. When the material is sputtered away, the chip is left with a rough surface.

While we have shown and described specific embodiments of our invention, obviously other embodiments may be obvious to ones skilled in the art in light of our disclosure. Specifically, the inventive process may be performed on n-type semiconductor as well as the described p-type. Naturally, a change in bias would be required. Although we have shown layer 13 of FIG. 1 as being continuous, it may be made in any pattern desired for readout purposes, etc. Moreover, light may be directed onto the completed chips from either side, rather than the one side as shown in FIG. 1. Obviously conductor or insulator layers transparent to the particular wavelength of interest must be used. Further, layers 11 and 12 may be combined, i.e. a single insulating layer of sufficient thickness may be etched to form the desired dimples, then covered directly with a conductor pattern.

Further, instead of exposing an electron-sensitive layer to a scanned electron beam, we may use a flood electron beam through a mask made with shortwave radiation or an electron beam. The short wave radiation may be ultraviolet or x-ray.

We claim:

1. A method of making a photocathode with at least a photon-absorbing portion and with an electron-emitting portion having a patterned surface, wherein said photocathode includes a semiconductor layer, including the steps of:

coating said layer with an insulating layer;
coating said insulating layer with an electron-sensitive layer;
scanning said electron-sensitive layer with an electron beam in a predetermined pattern;
developing said scanned layer to produce a perforated mask;
etching said insulating layer through said mask to produce a dimpled surface;
removing said mask;
depositing a conductive material onto the dimpled surface to form a conductive layer with a dimpled surface;

wherein said semiconductor layer acts as the photon-absorbing portion of said photocathode and said conductive layer acts as said electron-emitting portion of said photocathode when a voltage potential is applied therebetween to allow said photocathode to emit electrons in accordance with photons impinging thereon.

* * * * *